United States Patent
Aigo et al.

(10) Patent No.: US 10,626,520 B2
(45) Date of Patent: Apr. 21, 2020

(54) METHOD FOR PRODUCING EPITAXIAL SILICON CARBIDE SINGLE CRYSTAL WAFER

(71) Applicant: SHOWA DENKO K.K., Tokyo (JP)

(72) Inventors: Takashi Aigo, Tokyo (JP); Wataru Ito, Tokyo (JP); Tatsuo Fujimoto, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/747,849

(22) PCT Filed: Jul. 29, 2016

(86) PCT No.: PCT/JP2016/072421
§ 371 (c)(1),
(2) Date: Jan. 26, 2018

(87) PCT Pub. No.: WO2017/018533
PCT Pub. Date: Feb. 2, 2017

(65) Prior Publication Data
US 2018/0216251 A1 Aug. 2, 2018

(30) Foreign Application Priority Data
Jul. 29, 2015 (JP) .................. 2015-149742

(51) Int. Cl.
*C30B 29/36* (2006.01)
*H01L 29/161* (2006.01)
(Continued)

(52) U.S. Cl.
CPC ............ *C30B 29/36* (2013.01); *C30B 23/025* (2013.01); *C30B 25/02* (2013.01); *C30B 25/165* (2013.01);
(Continued)

(58) Field of Classification Search
CPC ....... C30B 29/36; C30B 25/186; C30B 25/02; C30B 25/20; C30B 25/165; C30B 25/18;
(Continued)

(56) References Cited

U.S. PATENT DOCUMENTS

2011/0006309 A1* 1/2011 Momose ............... C23C 16/325
257/77
2011/0031505 A1* 2/2011 Harada ............. H01L 21/02378
257/77
(Continued)

FOREIGN PATENT DOCUMENTS

EP   2 514 857 A1   10/2012
JP   2008-74664 A    4/2008
(Continued)

OTHER PUBLICATIONS

European Patent Office, English Computer translation of JP 2013239606 (Year: 2018).*

(Continued)

*Primary Examiner* — Matthew J Song
(74) *Attorney, Agent, or Firm* — Birch, Stewart, Kolasch & Birch, LLP

(57) ABSTRACT

A method for producing an epitaxial silicon carbide single crystal wafer comprised of a silicon carbide single crystal substrate having a small off angle on which a high quality silicon carbide single crystal film with little basal plane dislocations is provided, that is, a method for producing an epitaxial silicon carbide single crystal wafer epitaxially growing silicon carbide on a silicon carbide single crystal substrate using a thermal CVD method, comprising supplying an etching gas inside the epitaxial growth reactor to etch the surface of the silicon carbide single crystal substrate so that the arithmetic average roughness Ra value becomes 0.5 nm to 3.0 nm, then starting epitaxial growth to convert 95% or more of the basal plane dislocations at the surface of the silicon carbide single crystal substrate to threading edge dislocations.

16 Claims, 7 Drawing Sheets

(51) Int. Cl.
*H01L 21/02* (2006.01)
*C30B 25/02* (2006.01)
*C30B 25/16* (2006.01)
*C30B 25/18* (2006.01)
*C30B 23/02* (2006.01)

(52) U.S. Cl.
CPC ........ *C30B 25/186* (2013.01); *H01L 21/0262* (2013.01); *H01L 21/02378* (2013.01); *H01L 21/02433* (2013.01); *H01L 21/02529* (2013.01); *H01L 21/02661* (2013.01); *H01L 29/161* (2013.01)

(58) Field of Classification Search
CPC ............. C30B 25/183; H01L 21/02378; H01L 21/02529; H01L 21/02658; H01L 21/02019
See application file for complete search history.

(56) References Cited

U.S. PATENT DOCUMENTS

| | | | |
|---|---|---|---|
| 2011/0045281 A1* | 2/2011 | Myers-Ward | C30B 25/20 428/332 |
| 2011/0156058 A1* | 6/2011 | Hori | B24B 37/042 257/77 |
| 2012/0146056 A1* | 6/2012 | Momose | C30B 25/20 257/77 |
| 2012/0294790 A1 | 11/2012 | Sasaki et al. | |
| 2013/0062628 A1* | 3/2013 | Das | H01L 21/02378 257/77 |
| 2013/0143396 A1* | 6/2013 | Sudarshan | H01L 21/02658 438/503 |
| 2013/0157009 A1* | 6/2013 | Kondo | C30B 33/08 428/141 |
| 2013/0217213 A1* | 8/2013 | Aigo | C30B 25/02 438/478 |
| 2014/0117380 A1* | 5/2014 | Loboda | H01L 21/30625 257/77 |
| 2014/0175461 A1* | 6/2014 | Momose | C30B 25/20 257/77 |
| 2015/0221498 A1* | 8/2015 | Genba | C23C 16/325 438/478 |
| 2015/0267320 A1* | 9/2015 | Ohno | C30B 25/186 117/97 |
| 2015/0294867 A1 | 10/2015 | Torimi et al. | |
| 2015/0354090 A1 | 12/2015 | Tomita et al. | |
| 2017/0159208 A1* | 6/2017 | Aigo | C30B 25/14 |
| 2017/0365463 A1* | 12/2017 | Aigo | H01L 21/02378 |

FOREIGN PATENT DOCUMENTS

| | | | |
|---|---|---|---|
| JP | 2009-218575 A | 9/2009 | |
| JP | 2009-256138 A | 11/2009 | |
| JP | 2012-240892 A | 12/2012 | |
| JP | 2013239606 A * | 11/2013 | ........... H01L 21/205 |
| JP | 2015-824 A | 1/2015 | |
| WO | WO 2014/125550 A1 | 8/2014 | |
| WO | WO 2014/150400 A1 | 9/2014 | |

OTHER PUBLICATIONS

Fujiwara et al., "Characterization of in-grown stacking faults in 4H-SiC (0001) epitaxial layers and its impacts on high-voltage Schottkey barrier diodes," Applied Physics Letters (2005), vol. 87, pp. 051912-1-051912-3.

Ning et al., "Dislocation Cores and Hardness Polarity of 4H-SiC," J. Am. Ceram. Soc. (1997), vol. 80, No. 7, pp. 1645-1652.

Zhang et al., "Basal plane dislocation-free epitaxy of silicon carbide," Applied Physics Letters (2005), vol. 87, pp. 151913-1-151913-3.

* cited by examiner

METHOD FOR PRODUCING EPITAXIAL SILICON CARBIDE SINGLE CRYSTAL WAFER

TECHNICAL FIELD

The present invention relates to a method for producing an epitaxial silicon carbide single crystal wafer.

BACKGROUND ART

Silicon carbide (SiC) is excellent in heat resistance and mechanical strength and is physically and chemically stable, so is focused on as an environmentally resistant semiconductor material. Further, in recent years, demand for SiC single crystal substrates as substrates for high frequency, high withstand voltage electronic devices etc. has been rising.

If using an SiC single crystal substrate to fabricate a power device, high frequency device, etc., usually an SiC thin film is epitaxially grown on a substrate by the method called the "thermal CVD method" (thermal chemical vapor deposition method) or a dopant is directly implanted by the ion implantation method. However, in the latter case, annealing at a high temperature becomes required after implantation, so epitaxial growth is often used to form a thin film.

Here, as defects present in an SiC epitaxial film, there are triangular shaped defects, carrot defects, comet defects, etc. These are known as so-called "killer defects" which degrade the characteristics of devices. Furthermore, in recent years, basal plane dislocations in an epitaxial film have become an issue due to having an effect on the device characteristics. Such the basal plane dislocations are part of dislocations which are present in the SiC single crystal substrate, which are passed on to the epitaxial growth layer. It is known that usually they break into two partial dislocations and are accompanied with stacking defects between them (see NPLT 1). Further, if such stacking defects are present inside a device, the reliability is detrimentally affected (see NPLT 2), so reduction of the basal plane dislocations in the epitaxial growth layer is an important issue.

FIG. 1 is a schematic view of basal plane dislocations present in an SiC single crystal substrate. Reference numeral 1 shows basal plane dislocations. When SiC epitaxial growth on this SiC single crystal substrate proceeds, the dislocations advance more in the epitaxial growth direction ("a" direction) rather than advancing in the basal plane direction ("b" direction) resulting in the elastic energy held becoming smaller (lengths of dislocations becoming shorter) and are easily converted to edge dislocations with equal Burgers vectors. As a result, in general, about 90 to 93% of the basal plane dislocations of a SiC single crystal substrate are converted to threading edge dislocations at the substrate/epitaxial film interface. However, for example, the density of basal plane dislocations in a 4° off substrate having an off angle of 4° with respect to the (0001) plane is 4000/cm$^2$ or so, so the density of basal plane dislocations which remain (are left) in the epitaxial film by about 7 to 10% without being converted becomes 280 to 400/cm$^2$ or so.

On the other hand, electrodes of devices are currently 2 to 3 mm square in size, so a single device will contain at least 10 basal plane dislocations. This becomes a factor lowering the device characteristics and yield. An effective method for lowering the basal plane dislocation density is to reduce the off angle of the substrate more, but the number of steps on the substrate is decreased, therefore so-called "step-flow growth" becomes harder at the time of epitaxial growth. As a result, the above-mentioned killer defects increase and the resulting degradation of device characteristics and yield becomes a problem.

Therefore, in epitaxial SiC single crystal wafers, for which greater application to devices is expected in the future, it is necessary to further increase the conversion efficiency from basal plane dislocations to threading edge dislocations, reduce basal plane dislocations passed over from the substrate to the epitaxial growth layer, and suppress the increase of killer defects. As explained above, there is also the method of further reducing the off angle of the substrate to lower the basal plane dislocation density, but with the current state of the art, for suppressing killer defects to the practical device level, use of a 4° off or so substrate is the limit. As a result, basal plane dislocations remaining in the epitaxial film are insufficiently reduced and the device characteristics end up deteriorating and the yield falling.

Note that, it is known to etch an SiC single crystal substrate by molten KOH and epitaxially grow a film thereon so that the basal plane dislocations of the substrate are converted to threading edge dislocations (see NPLT 3). However, with such a method, it is necessary to individually perform the etching of the SiC single crystal substrate and epitaxial growth of SiC so the processing becomes complicated. In addition, the molten KOH causes deep etch pits to be formed, so the scars remain even after subsequent epitaxial growth and a smooth surface cannot be obtained. Further, it is difficult to sufficiently raise the conversion efficiency from basal plane dislocations to threading edge dislocation at the interface of the epitaxial growth layer and SiC single crystal substrate.

PLT 1 discloses a method of forming at least one suppression layer comprised of a silicon carbide single crystal film and having an Ra value of a surface roughness of 0.5 nm to 1.0 nm on a silicon carbide single crystal substrate so as to suppress the formation of defects. PLT 1 specifies that by making the Ra value of surface roughness within the above range, the number of atoms taken into a step is increased and the step flow is promoted. However, PLT 1 does not disclose or suggest the relationship between the etching of the silicon carbide single crystal substrate and the reduction of the basal plane dislocations. Further, PLT 1 does not quantitatively evaluate the rate of conversion of basal plane dislocations to threading edge dislocations.

PLT 2 discloses the process of epitaxially growing a buffer layer comprised of a silicon carbide crystal on the surface of a hydrogen etched silicon carbide single crystal substrate so as to form a buffer layer, etching the surface of the buffer layer by hydrogen, and epitaxially growing a silicon carbide crystal on the surface of the buffer layer to form a finishing layer. It discloses that by virtue of forming the buffer layer, propagation of the basal plane defects from the silicon carbide single crystal substrate is suppressed and that by forming the finishing layer on the surface of the hydrogen etched buffer layer, propagation of basal plane dislocations arising from the silicon carbide single crystal substrate is further reduced and a finishing layer reduced in defects arising from the buffer layer can be formed. However, with the method of production disclosed in PLT 2, if omitting the hydrogen etching of the buffer layer, the yield of the production of the semiconductor substrate is liable to become lower.

PLT 3 discloses a method of production of a silicon carbide ingot for forming a silicon carbide layer on a base substrate comprised of single crystal silicon carbide with an off angle of 0.1° to 10° in either the off angle direction of the <11-20> direction or <1-100> direction with respect to the (0001) plane. However, PLT 3 does not disclose or suggest the relationship between the etching of the base substrate and the reduction of basal plane dislocations. Further, in PLT 3, the rate of conversion of basal plane dislocations to threading edge dislocations is not quantitatively evaluated.

CITATION LIST

Patent Literature

PLT 1: Japanese Patent Publication No. 2008-74664A
PLT 2: Japanese Patent Publication No. 2009-218575A
PLT 3: Japanese Patent Publication No. 2012-240892A Nonpatent Literature NPLT 1: X. J. Ning et al.: Journal of American Ceramics Soc. Vol. 80 (1997) p. 1645.
NPLT 2: H. Fujiwara et al.: Applied Physics Letters Vol. 87 (2005) 051912
NPLT 3: Z. Zhang et al.: Applied Physics Letters. Vol. 87 151913 (2005)

SUMMARY OF INVENTION

Technical Problem

The present invention provides a method for producing an epitaxial SiC single crystal wafer able to obtain an epitaxial SiC single crystal wafer having a high quality epitaxial film reduced in basal plane dislocations remaining in the epitaxial growth layer even in epitaxial growth using a practical off angle SiC single crystal substrate.

Solution to Problem

The inventors engaged in intensive studies to solve the above problem and as a result discovered that when using the thermal CVD method to epitaxially grow SiC on an SiC single crystal substrate and produce an epitaxial SiC single crystal wafer, it is possible to reduce the basal plane dislocations remaining in the epitaxial growth layer in the following way.

That is, by supplying an etching gas inside of a reactor before epitaxial growth so as to etch the SiC single crystal substrate and form short step bunching starting from basal plane dislocations at the surface and thereby make the arithmetic average roughness Ra value of the surface of the SiC single crystal substrate a predetermined value, then starting the epitaxial growth, the basal plane dislocations at the surface of the SiC single crystal substrate can be effectively converted to threading edge dislocations. Further, the inventors found out that a predetermined buffer layer which is formed in order to stably convert the above-mentioned basal plane dislocations into threading edge dislocations can reduce basal plane dislocations more and in addition keep down an increase in killer defects, and the inventors thereby completed the present invention.

The gist of the present invention is as follows:

(1) A method for producing an epitaxial silicon carbide single crystal wafer, the method comprising: supplying a silicon-based material gas and a carbon-based material gas to an inside of an epitaxial growth reactor and epitaxially growing silicon carbide on a silicon carbide single crystal substrate using a thermal CVD method to produce an epitaxial silicon carbide single crystal wafer, wherein the method comprises, before starting epitaxial growth, supplying an etching gas inside the epitaxial growth reactor to pre-etch the surface of the silicon carbide single crystal substrate so that the arithmetic average roughness Ra value becomes 0.5 nm to 3.0 nm.

(2) The method for producing an epitaxial silicon carbide single crystal wafer according to (1) comprising, after the etching,
feeding a silicon-based material gas and carbon-based material gas into the epitaxial growth reactor, epitaxially growing silicon carbide on the surface of the etched silicon carbide single crystal substrate to form a buffer layer, and
then epitaxially growing silicon carbide on said buffer layer to form a device operating layer, and wherein a ratio C/Si of the number of C atoms with respect to the number of Si atoms of the silicon-based material gas and the carbon-based material gas at the time of forming the device operating layer is higher than the C/Si at the time of forming the buffer layer.

(3) The method for producing an epitaxial silicon carbide single crystal wafer according to (2) comprising making the C/Si a value of 0.3 to 0.6 to feed the silicon-based material gas and the carbon-based material gas inside the epitaxial growth reactor and epitaxially growing silicon carbide on the silicon carbide single crystal substrate by a 1600° C. to 1700° C. growth temperature and a 2 kPa to 10 kPa growth pressure to form a buffer layer of a thickness of 0.5 μm to 1 μm.

(4) The method for producing an epitaxial silicon carbide single crystal wafer according to (2) or (3) comprising making the C/Si a value of 1.0 to 2.0 to feed the silicon-based material gas and the carbon-based material gas inside the epitaxial growth reactor and forming a device operating layer by a 1600° C. to 1700° C. growth temperature and a 2 kPa to 10 kPa growth pressure.

(5) The method for producing an epitaxial silicon carbide single crystal wafer according to any one of (1) to (4) wherein the etching gas includes hydrogen gas.

(6) The method for producing an epitaxial silicon carbide single crystal wafer according to any one of (1) to (5) wherein the silicon carbide single crystal substrate has an off angle of tilt from the (0001) plane in the <11-20> direction of 2° to 4°.

(7) The method for producing an epitaxial silicon carbide single crystal wafer according to any one of (1) to (6) wherein 95% or more of the basal plane dislocations at the surface of the silicon carbide single crystal substrate are converted to threading edge dislocations at the interface of the buffer layer and the silicon carbide single crystal substrate.

Advantageous Effects of Invention

According to the present invention, for example, it is possible to provide a high quality epitaxial SiC single crystal wafer reduced in basal plane dislocations remaining inside an epitaxial film on an SiC single crystal substrate having a 4° or so practical off angle. Further, in the method for producing the present invention, since the CVD method is used, the hardware configuration is easy and controllability is excellent as well, so an epitaxial film with high uniformity and reproducibility can be obtained. Furthermore, a device using the epitaxial SiC single crystal wafer of the present invention is formed on a high quality epitaxial film with reduced density of basal plane dislocations, so the characteristics and yield are improved.

DESCRIPTION OF EMBODIMENTS

Below, the specific content of the present invention will be explained, but the invention is not limited to the following embodiments.

The apparatus which can be preferably used in epitaxial growth in the method for producing an epitaxial SiC single crystal wafer of the present invention is a horizontal type thermal CVD apparatus. The CVD method is simple in hardware configuration and enables control of growth by turning the gas on/off, so is a growth method excellent in controllability and reproducibility of the epitaxial film.

Figure 2:
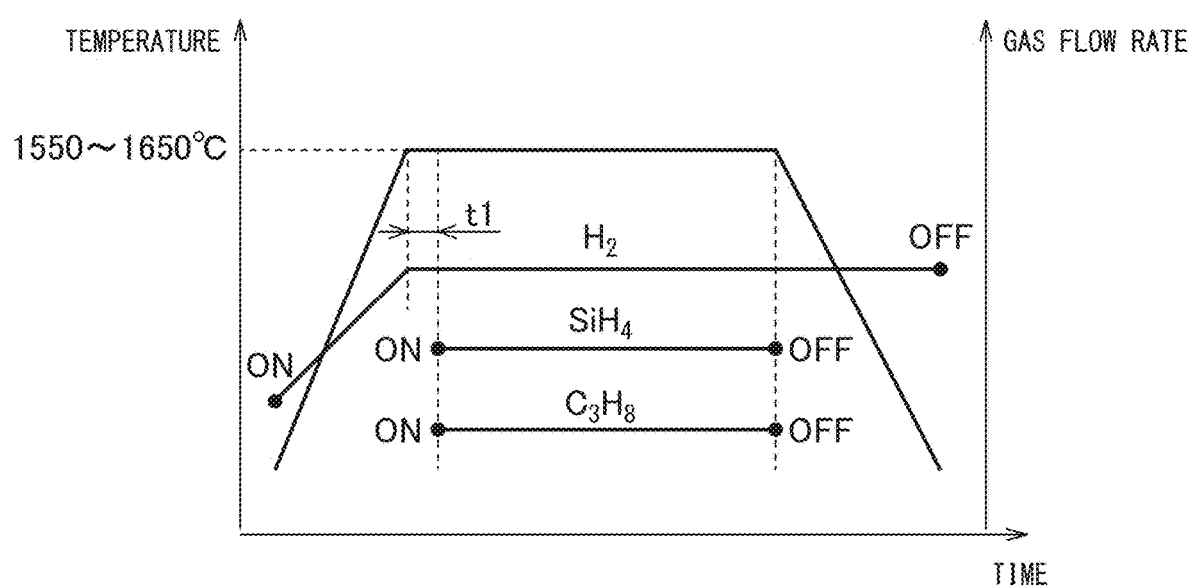
FIG. 2 is a view showing a growth sequence of an SiC epitaxial film according to the prior art.

First, for reference, epitaxial growth on an SiC single crystal substrate utilizing a method of production using conventional epitaxial film growth will be explained. In FIG. 2, a typical growth sequence at the time of conventional epitaxial film growth will be shown together with the timing of introduction of the gas.

An SiC single crystal substrate is set in an epitaxial growth reactor, the inside of the reactor is evacuated, then hydrogen gas is introduced and the pressure is adjusted to 5 kPa to 20 kPa. After that, while holding the pressure constant, the flow rate of hydrogen gas and the temperature of the reactor are raised. When reaching the growth temperature of 1550 to 1650° C., the surface of the SiC single crystal substrate is etched in a flow of 100 to 200 liter/minute of hydrogen gas for a time of t1. This etching using hydrogen gas has as its object the removal of the oxide film formed on the surface of the SiC single crystal substrate and removal of a layer changed due to processing etc. The etching time (t1) is usually about 10 minutes. Further, the amount (thickness) of the SiC single crystal substrate etched at this time is about 10 to 50 nm, while the Ra value of the surface roughness of the SiC single crystal substrate after etching is about 0.1 to 0.2 nm. Note that the surface roughness Ra shows the arithmetic average roughness prescribed in JIS B0601-1994.

After the end of etching, the material gases of $SiH_4$ and $C_3H_8$ are introduced into the epitaxial growth reactor to start growth. The $SiH_4$ flow rate is 100 to 150 $cm^3$ per minute, the $C_3H_8$ flow rate is 50 to 70 $cm^3$ per minute (ratio of number of C atoms to number of Si atoms in material gases (C/Si ratio) of 1 to 2 or so), and the growth rate is up to 10 μm per hour. This growth rate is determined considering the productivity since the usually utilized epitaxial layer has a thickness of about 10 μm. Further, when growing the film for a certain time and a desired film thickness is obtained, the introduction of $SiH_4$ and $C_3H_8$ is stopped and only hydrogen gas is supplied. In that state, the temperature is lowered. After the temperature falls to ordinary temperature, the introduction of hydrogen gas is stopped, the inside of the growth chamber is evacuated, inert gas is introduced into the growth chamber, the growth chamber is returned to atmospheric pressure, then the SiC single crystal substrate is taken out.

(Method for Producing Epitaxial SiC Single Crystal Wafer in Present Invention)

Next, the method for producing an epitaxial SiC single crystal wafer in the present invention will be explained using the growth sequence of FIG. 3.

Embodiment 1

(Etching Process)

An SiC single crystal substrate was set in an epitaxial growth reactor. The conditions until starting etching of the surface of the SiC single crystal substrate are similar to the conditions shown in FIG. 2. Therefore, the etching gas used, the pressure conditions of the etching gas, the temperature at the time of etching, and the gas flow rate are the same as the conditions of the etching process in the prior art. However, the etching time t2 is made 0.5 to 1.5 hours or so and short step bunching is made to be formed starting from the basal plane dislocations on the surface of the SiC single crystal substrate. The etching amount is about 500 nm to 1000 nm. This etching amount is the amount required for forming the short step bunching shown below. If too small, the step bunching density becomes insufficient and a sufficient efficiency of conversion of basal plane dislocations cannot be obtained, while if too great, surface roughness is formed. Even in this case, the efficiency of conversion of basal plane dislocations falls.

Figure 4:
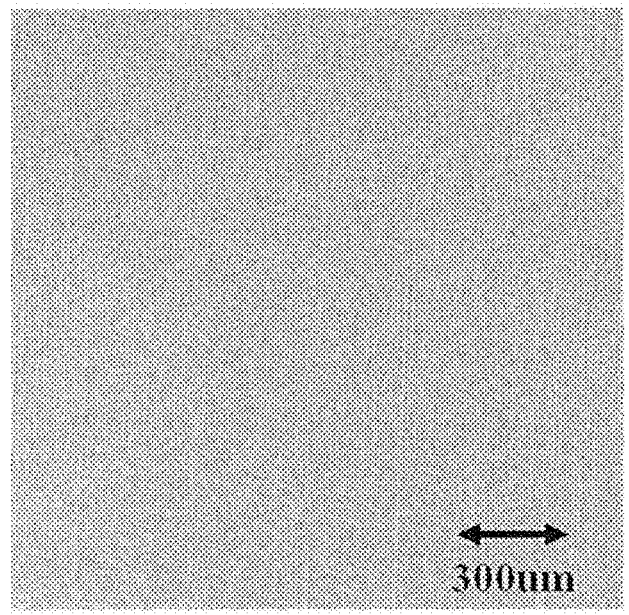
FIG. 4 is a photo of the surface conditions of an SiC single crystal substrate right after conducting pregrowth treatment etching according to one example of the present invention as observed through an optical microscope.

A photograph of the state of the surface of the SiC single crystal substrate after etching is shown in FIG. 4. The length 0.5 to 1 mm or so vertical lines observed in FIG. 4 (lines in up-down direction on paper) show short step bunchings. Parts of these lines bulge out in shape. At the centers of these short step bunchings, it is confirmed that there are basal plane dislocations of the SiC single crystal substrate. The crystal state around the basal plane dislocations change, so it is believed the etching proceeds slowly and the parts around the basal plane dislocations therefore bulge outward in shape. This state will be explained in FIGS. 5A to 5C.

Figure 1:
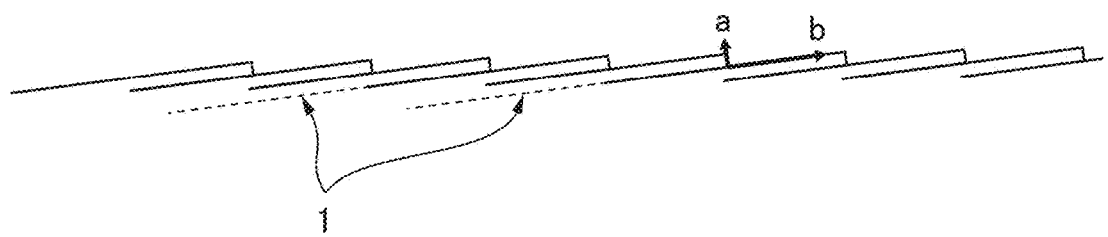
FIG. 1 is a view showing the behavior of basal plane dislocations of an SiC single crystal substrate when starting SiC epitaxial growth according to the prior art.
Figure 5:
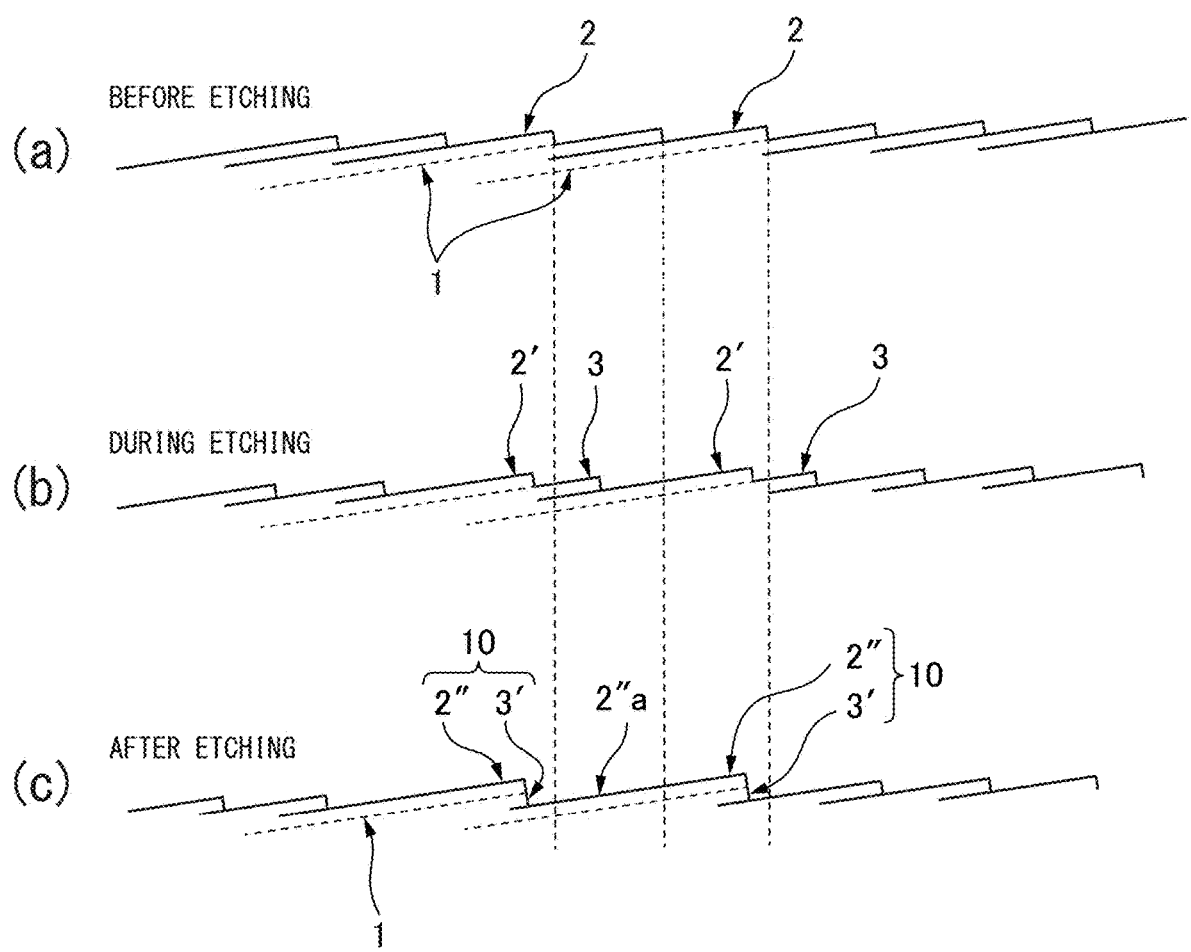
FIGS. 5A, 5B and 5C are views showing promotion of conversion of basal plane dislocations to threading edge dislocations of a substrate by the method of the present invention.

FIG. 5A is a cross-sectional schematic view of the surface of an SiC single crystal substrate showing a state similar to FIG. 1 in the case before etching or when, like in the prior art, almost no etching is performed. Reference numerals 1 shows basal plane dislocations of the SiC single crystal substrate, while reference numeral 2 shows a step where the crystal state changes around a basal plane dislocation.

The state during progression of etching is schematically shown in FIG. 5B. Steps 2' near the surface exits of the basal plane dislocations change in crystal state, so the step retreat amounts caused by the etching become small. Step 3 is a normal crystal state with no basal plane dislocation, so the step retreat amounts caused by the etching become greater than the steps 2'. Further, at the time of end of etching, as shown in FIG. 5C, steps 2' (FIG. 5B) near the surface exits of the basal plane dislocations are not etched much at all, but step 3 in the normal crystal state (FIG. 5B) is etched and retreats to the position of the steps 2" after etching the steps 2' (reference numeral 3' of FIG. 5C). In this way, after finishing etching, at the parts where basal plane dislocations appear at the surface, several steps combine and thereby the step difference becomes larger. As a result, it is believed that short step bunching such as shown in FIG. 4 is formed.

Figure 3:
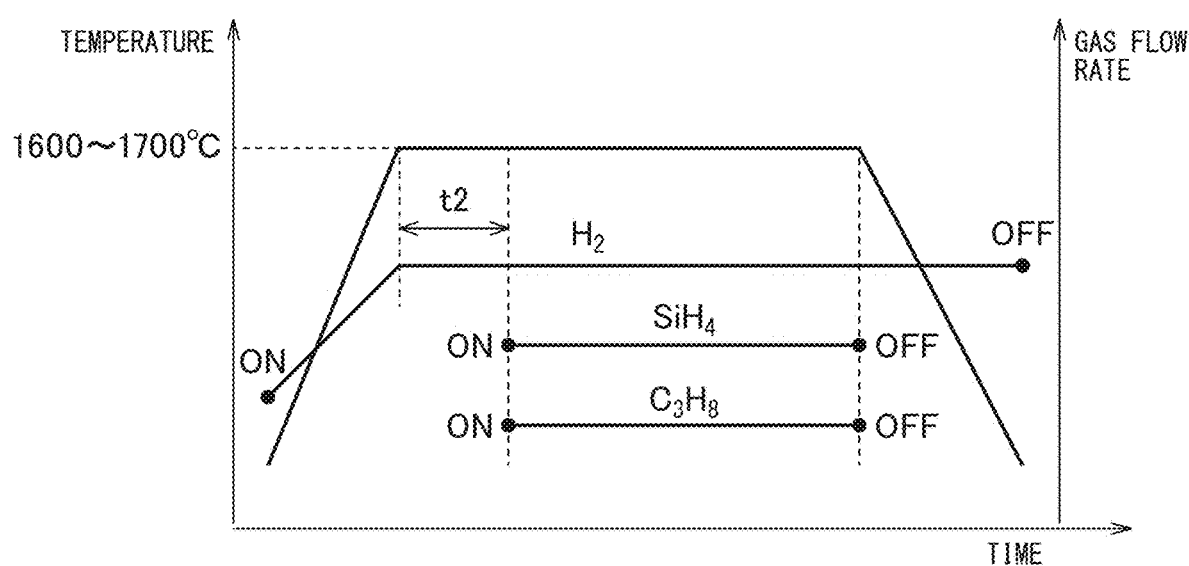
FIG. 3 is a view showing a growth sequence of SiC epitaxial growth after etching in the present invention.

It is possible to find in advance the relationship between the etching time t2 and the surface roughness Ra value of the SiC single crystal substrate after the etching wherein short step bunching is formed in FIG. 3. Based on the relationship of the etching time t2 and surface roughness Ra value, it is also possible to make the etching time t2 giving an Ra value of 0.5 nm to 3.0 nm a time of 0.5 to 1.5 hours or so. By making t2 a time of 0.5 to 1.5 hours, the etching amount becomes 500 nm to 1000 nm. At this time, Ra is 0.5 nm to 3.0 nm. Therefore, when Ra is outside this range or when the etching time is not 0.5 to 1.5 hours, in the same way as the above case where the etching amount is not 500 nm to 1000 nm, the efficiency of conversion of basal plane dislocations is not improved.

As shown in FIG. 3, after etching, a procedure similar to the case of FIG. 2 can be used to epitaxially grow SiC. By conducting the etching so that the surface roughness Ra value of the SiC single crystal substrate becomes 0.5 nm to 3.0 nm in this way and then epitaxially growing the film, in an epitaxial film on an SiC single crystal substrate having a 4° or so off angle, an excellent epitaxial film reducing the basal plane dislocations remaining in the film down to 5% or less of the value in the SiC single crystal substrate can be obtained.

This will be explained again using FIG. 5C. As explained in FIG. 1, even in a state not etching to give an Ra value of 0.5 nm to 3.0 nm, usually the majority of the basal plane dislocations of the SiC single crystal substrate are converted to threading edge dislocation. However, if focusing on the basal plane dislocations shown by reference numeral 1' in FIG. 5C, after etching so as to give the above Ra value, the terrace at the exit of the dislocation (that is, the terrace 2"a on step 2") becomes broader, so the basal plane dislocations have difficulty proceeding further in the basal plane direction ("b" direction of FIG. 1) and are more easily converted to threading edge dislocations. That is, basal plane dislocations easily advance in the "a" direction shown in FIG. 1. The inventors found that a bunched part 10 of steps formed near basal plane dislocations by the etching of the SiC single crystal substrate more efficiently converts basal plane distortions of the SiC single crystal substrate to threading edge dislocations. This conversion of the basal plane distortions to the threading edge dislocations is inevitably accompanied with short step bunching, so linkage of the Ra value of the surface and the conversion efficiency leads to the present invention.

According to the present invention, the rate of conversion of the basal plane dislocations to the threading edge dislocations can be made 95% or more compared with about 90 to 93% in the past. Further, when the Ra value is too small, no improvement can be seen in the effect of conversion of dislocations, while conversely if too great, the terrace parts are also etched, so the probability of dislocations advancing in the basal plane direction ("b" direction of FIG. 1) without being converted may conceivably rise. There is an optimum value in the Ra value.

This SiC single crystal substrate may be etched by supplying etching gas in an epitaxial growth reactor. Typically, it is possible to use hydrogen gas as an etching gas. It is sufficient to etch the SiC single crystal substrate by a flow rate of 100 to 200 L or so per minute. Besides hydrogen gas, for example, helium, argon, etc. may also be used as an etching gas. Further, for the temperature and pressure at the time of etching, the conditions in the reactor such as shown in FIG. 2 or FIG. 3 may be employed. Specifically, the temperature may be 1500° C. to 1700° C., while the pressure may be 1 kPa to 20 kPa.

Embodiment 2

(Process of Forming Buffer Layer)

In a second embodiment of the present invention, after the etching of the SiC single crystal substrate in the first embodiment, silicon-based and carbon-based material gases are supplied into the epitaxial growth reactor to epitaxially grow SiC and form a buffer layer and device operating layer. The procedure for forming the buffer layer and device operating layer will be explained using the growth sequence of FIG. 6. The process until setting SiC single crystal substrate and finishing the etching of the surface of the SiC single crystal substrate is similar to FIG. 3. After finishing etching, the material gases $SiH_4$ and $C_3H_8$ are introduced to start growth, but the buffer layer is formed first, then the device operating layer is formed. This buffer layer mainly performs the role of promoting conversion to threading edge dislocations and reducing basal plane dislocations, while the device operating layer is used for forming a device.

By forming the buffer layer at the time of start of epitaxial growth in this way, an excellent film in which basal plane dislocations remaining in the film are effectively reduced is obtained at the epitaxial film after growing the device operating layer. Specifically, as explained below, an epitaxial film is grown as a buffer layer by a low C/Si ratio and an epitaxial film with a high flatness is formed on the SiC single crystal substrate so that the basal plane dislocations on the surface of the SiC single crystal substrate are stably converted to threading edge dislocations. This will be explained with reference to FIGS. 7A and 7B.

Figure 7A:
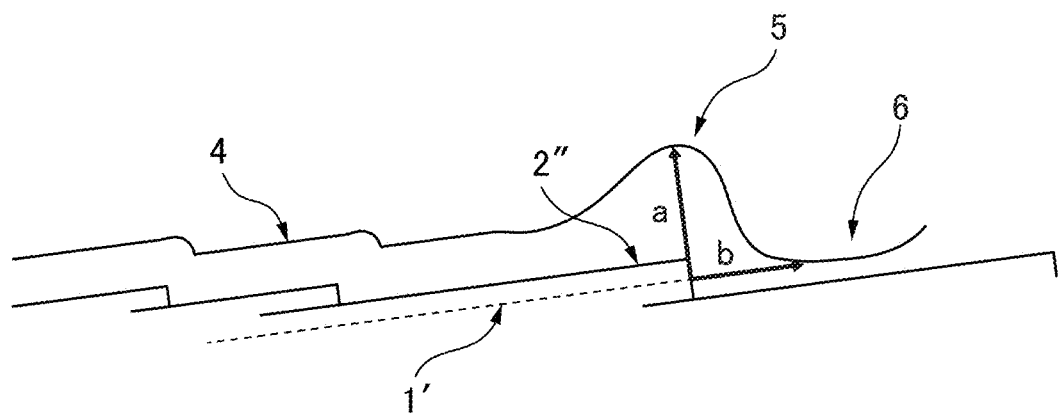
FIG. 7A is a view showing the effects of the flatness of a buffer layer when basal plane dislocations of an SiC single crystal substrate are converted to threading edge dislocations according to the present invention and shows the case where the flatness of the buffer layer is not maintained.

FIG. 7A shows the case of growing an epitaxial layer 4 by a C/Si ratio similar to the case of forming a device operating layer on the SiC single crystal substrate after etching. At the part 2" where short step bunching occurred near the basal plane dislocation 1 of the SiC single crystal substrate, step-flow growth becomes harder due to the disturbance of the crystal state. As a result, in particular, the thickness of the film increases at the initial stage of growth. As shown by the reference numeral 5, the edge part piles up, while conversely at the bottom part 6, the thickness of the film decreases like the sloping bottom of a hill. If this occurs, a situation arises where the basal plane dislocations 1 of the SiC single crystal substrate become shorter the more in the "b" direction, so remain as basal plane dislocations in the epitaxial film and the effect of optimization of etching before growth is reduced. In a buffer layer under this condition, the Ra value of the surface exceeds 3 nm.

Figure 7B:
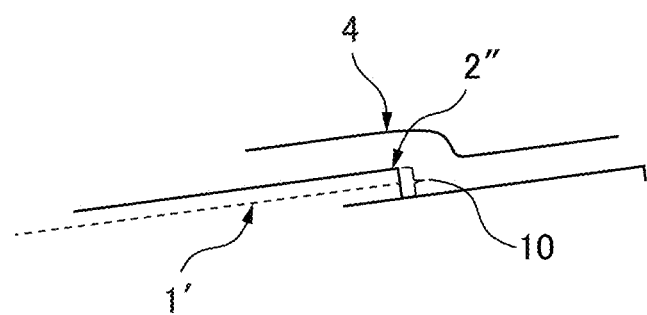
FIG. 7B is a view showing the effects of the flatness of a buffer layer when basal plane dislocations of an SiC single crystal substrate are converted to threading edge dislocations according to the present invention and shows the case where the flatness of the buffer layer is maintained.

On the other hand, as shown in FIG. 7B, by growing an epitaxial layer on the etched SiC single crystal substrate by a low C/Si ratio, it is possible to form an epitaxial film 4 with a high flatness and uniformity. Due to this, at the part 2" where a bunched part 10 of the steps is formed as well, it is believed that a flat state such as shown by the numeral 4 is formed. Even if the epitaxial film 4 is not etched etc., the epitaxial film 4 is kept in the condition wherein basal plane dislocations 1' are easily converted to threading edge dislocations. That is, to form a bunched part 10 of steps along with short step bunching by etching and make the effect of an SiC single crystal substrate raised in conversion efficiency of basal plane dislocations more reliable, it becomes important to grow the film by a low C/Si ratio and form an epitaxial film 4 with a high flatness as the buffer layer. The surface Ra value of the buffer layer in this case is 1 to 3 nm.

According to the present invention, in an epitaxial film on the SiC single crystal substrate having a practical off angle of about 4°, an excellent epitaxial film reduced in basal plane dislocations remaining in the film is obtained. The thickness of the buffer layer grown on the SiC single crystal substrate after etching is 0.5 μm to 1 μm so that the conversion of basal plane dislocations of the SiC single crystal substrate on which the short step bunchings were formed by etching is completed. This buffer layer is grown by a low C/Si ratio, so if becoming thicker, the growth time becomes longer. Further, the stability of the grown film becomes a problem due to fluctuation of the C/Si ratio. Considering this etc. an upper limit of the film thickness is determined.

Further, the ratio (C/Si ratio) of the number of C atoms with respect to the number of Si atoms in the material gases at the time of growing the buffer layer is 0.3 to 0.6. This, as explained above, is necessary for promoting step flow growth. Because if the ratio (C/Si ratio) is larger than 0.6, the effect becomes smaller, while if the ratio (C/Si ratio) is smaller than 0.3, formation of Si droplets becomes a problem. For example, when using a $SiH_4$ as the silicon-based material gas and $C_3H_8$ as the carbon-based material gas, the $SiH_4$ flow rate at the time of growing the buffer layer is 50 to 60 $cm^3$ per minute while the $C_3H_8$ flow rate is 6 to 10 $cm^3$ per minute.

Further, if the growth temperature of the epitaxial film of the buffer layer is less than 1600° C., the film falls in quality, while if over 1700° C., reevaporation of atoms from the surface increases, so the growth temperature of the epitaxial film is made 1600° C. to 1700° C. The pressure at the time of growth also affects the quality of the film. If too low, the surface roughness increases, while if too high, the formation of Si droplets becomes a problem, so the pressure at the time of forming the buffer layer is made 2 kPa to 10 kPa.

Embodiment 3

(Process of Forming Device Operating Layer)

In the third embodiment, after forming the buffer layer in the second embodiment, the device operating layer is grown on the basis of growth conditions corresponding to the application of the device used. Further, no process of etching the buffer layer is inserted between the buffer layer forming process and the device operating layer. A C/Si value higher than the C/Si of the silicon-based material gas and carbon-based material gas at the time of forming the buffer layer is used to run silicon-based material gas and carbon-based material gas and directly epitaxially grow silicon carbide on the buffer layer to form a device operating layer.

Specifically, the ratio of the number of C atoms with respect to the number of Si atoms in the material gas (C/Si ratio) should be 1.0 to 2.0. The growth temperature should be 1600° C. to 1700° C., while the growth pressure should be 2 kPa to 10 kPa. The thickness of this device operating layer may be suitably set according to its application etc., but preferably is 5 μm to 50 μm. Note that as the material gases used for forming the buffer layer and the device operating layer, in the above growth sequence, the case of $SiH_4$ and $C_3H_8$ was illustrated, but the material gases are not limited to these. For example, it is possible to use $SiHCl_3$, $SiH_2Cl_2$, $SiC_{14}$, etc. as the silicon-based material gas and possible to use $C_2H_4$, $CH_4$, etc. as the carbon-based material gas. Further, when growing these epitaxial films, it is also possible to simultaneously supply $N_2$ or another doping gas.

The off angle of the SiC single crystal substrate used in the present invention preferably may be an off angle tilted from the (0001) plane in the <11-20> direction of 2° to 4°. If the off angle is larger than 4°, the angle formed by the basal plane dislocations in the substrate with the surface having the off angle becomes larger. Both if advancing in the basal plane direction at the time of epitaxial growth ("b" direction in FIG. 1) and if advancing in a direction vertical to the same ("a" direction in FIG. 1), the dislocations no longer change much in length, therefore the effect of the present invention becomes hard to obtain. Conversely, if smaller than 2°, the number of basal plane dislocations in the initial state is small and the terraces become too broad, so the detrimental effects of inhibiting step flow growth etc. become greater.

The device preferably formed on the epitaxial SiC single crystal wafer grown in this way is not particularly limited, but, for example, a Schottky barrier diode, PIN diode, MOS diode, MOS transistor, etc. may be mentioned. Among these it is suitable for obtaining a device used for power control.

EXAMPLES

Below, the present invention will be specifically explained based on the examples etc., but the present invention is not limited to the content of these.

Reference Example 1

First, the surface of the SiC single crystal substrate was etched so as to give an arithmetic average roughness Ra value of 0.5 nm to 3.0 nm, then the device operating layer was directly formed without providing a buffer layer. Such examples are shown as Reference Examples 1 to 4.

A film was epitaxially grown in the following way on an Si surface of an SiC single crystal substrate having a 4H polytype. The SiC single crystal substrate was sliced from a 4-inch (100 mm) wafer-use SiC single crystal ingot to an approximately 400 μm thickness, roughly ground, and polished normally by diamond abrasive and chemical mechanical polishing (CMP). This SiC single crystal substrate had an off angle tilted from the (0001) plane in the <11-20> direction.

Figure 6:
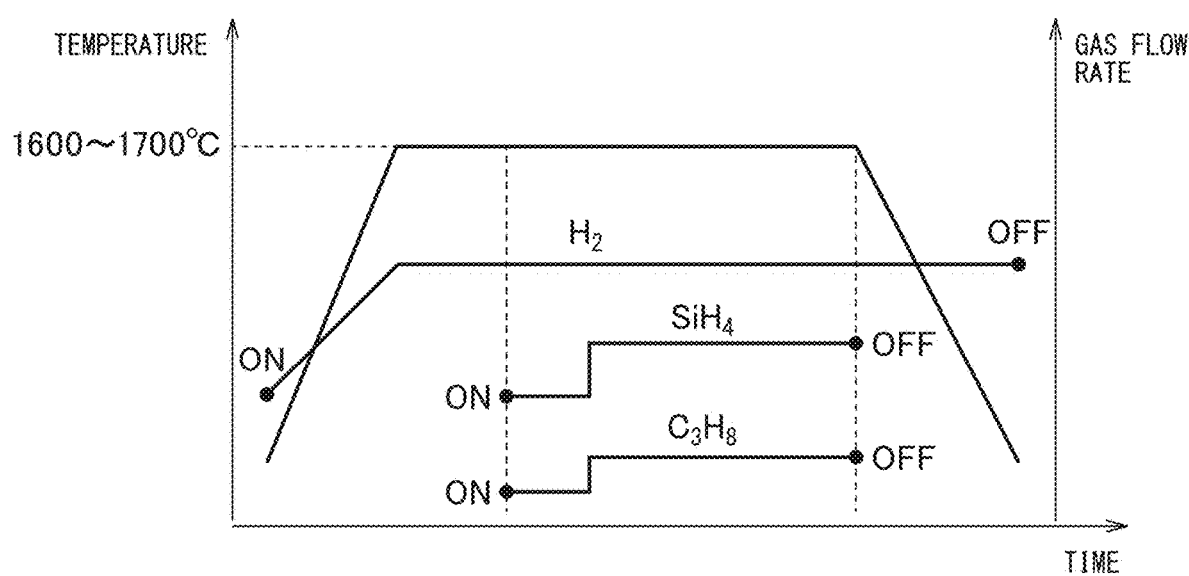
FIG. 6 is a view showing a growth sequence of an SiC epitaxial film according to an example of the present invention.

The growth procedure was made the growth sequence of FIG. 6. Specifically, an epitaxial growth reactor was set with the SiC single crystal substrate, the inside of the reactor was evacuated, then hydrogen gas was introduced while adjusting the pressure to 10 kPa. After that, while holding the pressure constant, the flow rate of the hydrogen gas and the temperature of the reactor were raised. Finally, the hydrogen gas was made 150 L per minute and the temperature of the reactor was made 1635° C. After that, the pressure was adjusted to 2 kPa and the SiC single crystal substrate was etched in hydrogen gas for 40 minutes. At this time, the surface of the SiC single crystal substrate etched under the same conditions in advance was observed by an atomic force microscope (AFM). Based on the observations, the surface roughness Ra value of the etched SiC single crystal substrate became 0.5 nm. After etching, the temperature of the reactor was raised to 1650° C., the $SiH_4$ flow rate was made 150 cm³ per minute, the $C_3H_8$ flow rate was made 65 cm³ per minute to start growth, and the epitaxial layer was grown to a thickness of 10 μm (C/Si ratio of 1.3). The grown epitaxial layer is the device operating layer for device operation. No buffer layer for further raising the conversion efficiency of the basal plane dislocation is allowed to be formed.

Figure 8:
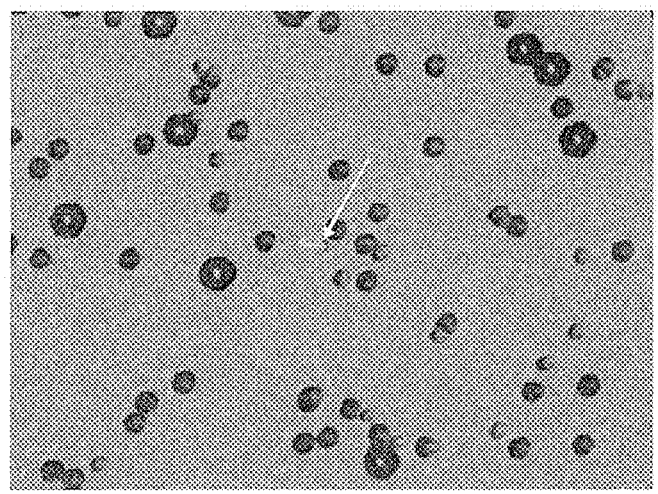
FIG. 8 is an optical micrograph showing the etch pits appearing when etching the surface of an epitaxial film by molten KOH.

The surface of a device operating layer was obtained by etching a film epitaxially grown in this way by molten KOH and showed etch pits. An optical micrograph of the surface of the device operating layer is shown in FIG. 8. The arrow mark in the photograph of FIG. 8 is an etch pit caused by basal plane dislocation. The other pits are due to threading screw dislocations or threading edge dislocation. The density of basal plane dislocations in the epitaxial film obtained by such a method was evaluated for comparison with the density of basal plane dislocations of a SiC single crystal substrate, whereupon, in this Reference Example 1, the percent of basal plane dislocations at the surface of the SiC single crystal substrate which continued into the epitaxial film was 3.5%. That is, 96.5% of the basal plane dislocations on the surface of the SiC single crystal substrate are converted. These are believed to have been converted threading edge dislocations. Note that the growth conditions of the epitaxial film and conversion efficiency are shown together in Tables 1 and 2.

Reference Example 2

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The process up to the start of etching in the hydrogen gas was similar to Reference Example 1, but in this Reference Example 2, the etching time was made 60 minutes and the surface roughness Ra value of the etched SiC single crystal substrate was made 1.3 nm. After etching, the same procedure was performed as in Reference Example 1 to epitaxially grow a film (no formation of buffer layer). The grown epitaxial film was etched by molten KOH and the dislocation density due to the etch pits was evaluated, whereupon the rate of conversion of basal plane dislocations on the SiC single crystal substrate surface was 97%.

Reference Example 3

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The process up to the start of etching in the hydrogen gas was similar to Reference Example 1, but in this Reference Example 3, the etching time was made 80 minutes and the surface roughness Ra value of the etched SiC single crystal substrate was made 3.0 nm. After etching, the same procedure was performed as in Reference Example 1 to epitaxially grow a film (no formation of buffer layer). The grown epitaxial film was etched by molten KOH and the dislocation density due to the etch pits was evaluated, whereupon the rate of conversion of basal plane dislocations on the SiC single crystal substrate surface was 97%.

Reference Example 4

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 2°. Except for this, the etching by hydrogen gas, the Ra value of the etched SiC single crystal substrate, and the conditions of epitaxial growth were similar to Reference Example 1 (no formation of buffer layer). The grown epitaxial film was etched by molten KOH and the dislocation density due to the etch pits was evaluated, whereupon the rate of conversion of basal plane dislocations on the SiC single crystal substrate surface was 96%.

Inventive Example 1

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was raised to 1650° C. to grow a buffer layer. The growth conditions were an $SiH_4$ flow rate of 50 cm³ per minute, a $C_3H_8$ flow rate of 6.7 cm³ per minute (C/Si ratio of 0.4), and a growth pressure of 6 kPa to thereby obtain a thickness 0.5 μm SiC epitaxial film.

After making the buffer layer grow, the flow rate of $SiH_4$ was made 150 cm³ per minute, the flow rate of $C_3H_8$ was made 65 cm³ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 98.5%.

Inventive Example 2

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 2. After etching, the temperature of the reactor was raised to 1650° C. to grow a buffer layer. The growth conditions were an $SiH_4$ flow rate of 50 cm³ per minute, a $C_3H_8$ flow rate of 5 cm³ per minute (C/Si ratio of 0.3), and a growth pressure of 6 kPa to thereby obtain a thickness 0.8 μm SiC epitaxial film.

After making the buffer layer grow, the flow rate of $SiH_4$ was made 150 cm³ per minute, the flow rate of $C_3H_8$ was made 65 cm³ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 98%.

Inventive Example 3

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 3. After etching, the temperature of the reactor was raised to 1650° C. to grow a buffer layer. The growth conditions were an $SiH_4$ flow rate of 50 cm$^3$ per minute, a $C_3H_8$ flow rate of 10 cm$^3$ per minute (C/Si ratio of 0.6), and a growth pressure of 6 kPa to thereby obtain a thickness 1 μm SiC epitaxial film.

After making the buffer layer grow, the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 97.8%.

Inventive Example 4

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 2°. Except for this, the same procedure was followed as in Inventive Example 1 to etch the surface and grow an epitaxial film. The grown epitaxial film was etched by molten KOH and the dislocation density due to the etch pits was evaluated, whereupon the rate of conversion of basal plane dislocations of the surface of the SiC single crystal substrate was 97.5%.

Comparative Example 1

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The process up to etching in hydrogen gas was similar to Reference Example 1, but the etching time was made 10 minutes and the surface roughness Ra value of the SiC single crystal substrate after etching was made 0.2 nm. After etching, the film was epitaxially grown in the same way as Reference Example 1 (no formation of buffer layer). The grown epitaxial film was etched by molten KOH and the dislocation density due to the etch pits was evaluated, whereupon the rate of conversion of basal plane dislocations of the surface of the SiC single crystal substrate was 91%. The conversion efficiency fell compared with the reference example.

Comparative Example 2

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The process up to etching in hydrogen gas was similar to Reference Example 1, but the etching time was made 100 minutes and the surface roughness Ra value of the SiC single crystal substrate after etching was made 4 nm. After etching, the film was epitaxially grown in the same way as Reference Example 1 (no formation of buffer layer). The grown epitaxial film was etched by molten KOH and the dislocation density due to the etch pits was evaluated, whereupon the rate of conversion of basal plane dislocations of the surface of the SiC single crystal substrate was 90.5%. The conversion efficiency fell compared with the reference example.

Comparative Example 3

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was raised to 1650° C. to grow a buffer layer. The growth conditions were an $SiH_4$ flow rate of 50 cm$^3$ per minute, a $C_3H_8$ flow rate of 16.7 cm$^3$ per minute (C/Si ratio of 1.0), and a growth pressure of 6 kPa to thereby obtain a thickness 0.5 μm SiC epitaxial film.

After making the buffer layer grow, the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 93.5%. It is believed that the conversion efficiency fell due to the C/Si ratio at the time of buffer layer growth being high and the flatness of the film deteriorating.

Comparative Example 4

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was raised to 1650° C. to grow a buffer layer. The growth conditions were an $SiH_4$ flow rate of 50 cm$^3$ per minute, a $C_3H_8$ flow rate of 6.7 cm$^3$ per minute (C/Si ratio of 0.4), and a growth pressure of 6 kPa to thereby obtain a thickness 2 μm SiC epitaxial film.

After making the buffer layer grow, the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 93%. It is believed that due to the thickness of the buffer layer being large and the growth time becoming longer, the flatness of the film was degraded due to fluctuation of the C/Si ratio and the conversion efficiency fell.

Comparative Example 5

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was lowered to 1580° C. to grow a buffer layer. The growth conditions were an $SiH_4$ flow rate of 50 cm$^3$ per minute, a $C_3H_8$ flow rate of 6.7 cm$^3$ per minute (C/Si ratio of 0.4), and a growth pressure of 6 kPa to thereby obtain a thickness 0.5 μm SiC epitaxial film.

After making the buffer layer grow, the temperature of the reactor was raised to 1650° C., the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 91%. It is believed that due to the buffer layer being grown at a low temperature, the step flow growth did not proceed evenly, the flatness of the film was degraded, and the conversion efficiency fell.

Comparative Example 6

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was raised to 1720° C. to grow a buffer layer. The growth conditions were an $SiH_4$ flow rate of 50 cm$^3$ per minute, a $C_3H_8$ flow rate of 6.7 cm$^3$ per minute (C/Si ratio of 0.4), and a growth pressure of 6 kPa to thereby obtain a thickness 0.5 μm SiC epitaxial film.

After making the buffer layer grow, the temperature of the reactor was lowered to 1650° C., the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 90.5%. It is believed that due to the buffer layer being grown at a high temperature, there was large reevaporation of atoms from the surface, the flatness of the film was degraded, and the conversion efficiency fell.

Comparative Example 7

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was raised to 1650° C. to grow a buffer layer. The growth conditions were an $SiH_4$ flow rate of 50 cm$^3$ per minute, a $C_3H_8$ flow rate of 6.7 cm$^3$ per minute (C/Si ratio of 0.4), and a growth pressure of 1.5 kPa to thereby obtain a thickness 0.5 μm SiC epitaxial film.

After making the buffer layer grow, the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 91%. It is believed that due to the surface roughness due to the buffer layer being grown under a low pressure, the flatness of the film was degraded so the conversion efficiency fell.

Comparative Example 8

A film was epitaxially grown on the Si surface of a 4-inch (100 mm) SiC single crystal substrate which was sliced, roughly ground, and polished in the same way as Reference Example 1 having a 4H polytype. The off angle of the SiC single crystal substrate was 4° (off direction same as Reference Example 1). The etching by hydrogen gas and the Ra value of the etched SiC single crystal substrate were similar to Reference Example 1. After etching, the temperature of the reactor was raised to 1650° C. to grow a buffer layer. The growth conditions were an $SiH_4$ flow rate of 50 cm$^3$ per minute, a $C_3H_8$ flow rate of 6.7 cm$^3$ per minute (C/Si ratio of 0.4), and a growth pressure of 12 kPa to thereby obtain a thickness 0.5 μm SiC epitaxial film.

After making the buffer layer grow, the flow rate of $SiH_4$ was made 150 cm$^3$ per minute, the flow rate of $C_3H_8$ was made 65 cm$^3$ per minute (C/Si ratio of 1.3), and the pressure was made 2 kPa to grow an epitaxial layer for device operation (device operating layer) to 10 μm. The grown epitaxial film was etched by molten KOH and the dislocation density due to the etch pits was evaluated, whereupon the rate of conversion of basal plane dislocations on the SiC single crystal substrate surface was 91.2%. It is believed that since the buffer layer was grown under a high pressure, Si droplets were formed and the flatness of the film was degraded so the conversion efficiency fell.

The conditions and results of evaluation of the above Reference Examples 1 to 4, Inventive Examples 1 to 4, and Comparative Examples 1 to 8 are shown in Table 1 and Table 2.

TABLE 1

| | | | | Buffer layer | | | | | Conversion efficiency (%) |
| --- | --- | --- | --- | --- | --- | --- | --- | --- | --- |
| | off angle (°) | H2 etching time (min) | Ra (nm) | Thickness (μm) | C/Si ratio | Temp. (° C.) | Pressure (kPa) | Device operating layer | |
| Ref. Ex. 1 | 4 | 40 | 0.5 | — | — | — | — | 1650° C., C/Si = 1.3, 2 kPa, 10 μm | 96.5 |

TABLE 1-continued

|   | off angle (°) | H2 etching time (min) | Ra (nm) | Buffer layer Thickness (μm) | C/Si ratio | Temp. (° C.) | Pressure (kPa) | Device operating layer | Conversion efficiency (%) |
|---|---|---|---|---|---|---|---|---|---|
| Ref. Ex. 2 | 4 | 60 | 1.3 | — | — | — | — | 1650° C., C/Si = 1.3, 2 kPa, 10 μm | 97 |
| Ref. Ex. 3 | 4 | 80 | 3 | — | — | — | — | 1650° C., C/Si = 1.3, 2 kPa, 10 μm | 97 |
| Ref. Ex. 4 | 2 | 40 | 0.5 | — | — | — | — | 1650° C., C/Si = 1.3, 2 kPa, 10 μm | 96 |
| Inv. Ex. 1 | 4 | 40 | 0.5 | 0.5 | 0.4 | 1650 | 6 | 1650° C., C/Si = 1.3, 2 kPa, 10 μm | 98.5 |
| Inv. Ex. 2 | 4 | 60 | 1.3 | 0.8 | 0.3 | 1650 | 6 | 1650° C., C/Si = 1.3, 2 kPa, 10 μm | 98 |
| Inv. Ex. 3 | 4 | 80 | 3 | 1 | 0.6 | 1650 | 6 | 1650° C., C/Si = 1.3, 2 kPa, 10 μm | 97.8 |
| Inv. Ex. 4 | 2 | 40 | 0.5 | 0.5 | 0.4 | 1650 | 6 | 1650° C., C/Si = 1.3, 2 kPa, 10 μm | 97.5 |

TABLE 2

|   | off angle (°) | H2 etching time (min) | Ra (nm) | Buffer layer Thickness (μm) | C/Si ratio | Temp. (° C.) | Pressure (kPa) | Device operating layer | Conversion efficiency (%) |
|---|---|---|---|---|---|---|---|---|---|
| Comp. Ex. 1 | 4 | 10 | 0.2 | — | — | — | — | 1650° C., C/Si = 1.3, 2 kPa, 10 μm | 91 |
| Comp. Ex. 2 | 4 | 100 | 4 | — | — | — | — | 1650° C., C/Si = 1.3, 2 kPa, 10 μm | 90.5 |
| Comp. Ex. 3 | 4 | 40 | 0.5 | 0.5 | 1.0 | 1650 | 6 | 1650° C., C/Si = 1.3, 2 kPa, 10 μm | 93.5 |
| Comp. Ex. 4 | 4 | 40 | 0.5 | 2 | 0.4 | 1650 | 6 | 1650° C., C/Si = 1.3, 2 kPa, 10 μm | 93 |
| Comp. Ex. 5 | 4 | 40 | 0.5 | 0.5 | 0.4 | 1580 | 6 | 1650° C., C/Si = 1.3, 2 kPa, 10 μm | 91 |
| Comp. Ex. 6 | 4 | 40 | 0.5 | 0.5 | 0.4 | 1720 | 6 | 1650° C., C/Si = 1.3, 2 kPa, 10 μm | 90.5 |
| Comp. Ex. 7 | 4 | 40 | 0.5 | 0.5 | 0.4 | 1650 | 1.5 | 1650° C., C/Si = 1.3, 2 kPa, 10 μm | 91 |
| Comp. Ex. 8 | 4 | 40 | 0.5 | 0.5 | 0.4 | 1650 | 12 | 1650° C., C/Si = 1.3, 2 kPa, 10 μm | 91.2 |

INDUSTRIAL APPLICABILITY

According to this invention, in epitaxial growth on an SiC single crystal substrate, it is possible to prepare an epitaxial SiC single crystal wafer having a high quality epitaxial film with few basal plane dislocations. For this reason, if forming an electronic device on such an epitaxial SiC single crystal wafer, the characteristics and yield of the device can be expected to be improved.

The invention claimed is:

1. A method for producing an epitaxial silicon carbide single crystal wafer by epitaxially growing silicon carbide by a thermal CVD method, the method comprising:

before starting epitaxial growth, supplying an etching gas to the inside of an epitaxial growth reactor to etch a surface of the silicon carbide single crystal substrate by 500 nm to 1000 nm so that the arithmetic average roughness Ra value becomes 1.3 nm to 3.0 nm and to form step bunching starting from the basal plane dislocations on the surface of said silicon carbide single crystal substrate, the step bunching having a length of 0.5 to 1 mm and bulging outward in shape, and after said etching, feeding a silicon-based material gas and a carbon-based material gas into said epitaxial growth reactor, epitaxially growing silicon carbide, by the thermal CVD method, on the surface of said etched silicon carbide single crystal substrate to form a buffer layer wherein said silicon-based material gas and said carbon-based material gas are fed at a C/Si ratio of 0.3 to 0.6 to the inside of said epitaxial growth reactor to epitaxially grow silicon carbide on said silicon carbide single crystal substrate by a 1600° C. to 1700° C. growth temperature and a 2 kPa to 10 kPa growth pressure so that the silicon carbide is formed into the buffer layer of a thickness of 0.5 μm to 1 μm, and then epitaxially growing silicon carbide on said buffer layer to form a device operating layer, so that the epitaxial silicon carbide single crystal wafer is produced, wherein a ratio C/Si of the number of C atoms with respect to the number of Si atoms of said silicon-based material gas and said carbon-based material gas for forming the device operating layer is higher than the C/Si for forming the buffer layer, and wherein 95% or more of the basal plane dislocations at the surface of said silicon carbide single crystal substrate are converted to threading edge dislocations.

2. The method for producing an epitaxial silicon carbide single crystal wafer according to claim 1 comprising making said C/Si a value of 1.0 to 2.0 to feed said silicon-based material gas and said carbon-based material gas inside said epitaxial growth reactor and forming the device operating layer by a 1600° C. to 1700° C. growth temperature and a 2 kPa to 10 kPa growth pressure.

3. The method for producing an epitaxial silicon carbide single crystal wafer according to claim 1, wherein said etching gas includes hydrogen gas.

4. The method for producing an epitaxial silicon carbide single crystal wafer according to claim 1, wherein said etching gas includes hydrogen gas.

5. The method for producing an epitaxial silicon carbide single crystal wafer according to claim 1, wherein said etching gas includes hydrogen gas.

6. The method for producing an epitaxial silicon carbide single crystal wafer according to claim 2, wherein said etching gas includes hydrogen gas.

7. The method for producing an epitaxial silicon carbide single crystal wafer according to claim 1, wherein said silicon carbide single crystal substrate has an off angle of tilt from the (0001) plane in the <11-20> direction of 2° to 4°.

8. The method for producing an epitaxial silicon carbide single crystal wafer according to claim 1, wherein said silicon carbide single crystal substrate has an off angle of tilt from the (0001) plane in the <11-20> direction of 2° to 4°.

9. The method for producing an epitaxial silicon carbide single crystal wafer according to claim 1, wherein said silicon carbide single crystal substrate has an off angle of tilt from the (0001) plane in the <11-20> direction, of 2° to 4°.

10. The method for producing an epitaxial silicon carbide single crystal wafer according to claim 2, wherein said silicon carbide single crystal substrate has an off angle of tilt from the (0001) plane in the <11-20> direction of 2° to 4°.

11. The method for producing an epitaxial silicon carbide single crystal wafer according to claim 3, wherein said silicon carbide single crystal substrate has an off angle of tilt from the (0001) plane in the <11-20> direction of 2° to 4°.

12. The method for producing an epitaxial silicon carbide single crystal wafer according to claim 4, herein said silicon carbide single crystal substrate has an off angle of tilt from the (0001) plane in the <11-20> direction of 2° to 4°.

13. The method for producing an epitaxial silicon carbide single crystal wafer according to claim 5, wherein said silicon carbide single crystal substrate has an off angle of tilt from the (0001) plane in the <11-20> direction of 2° to 4°.

14. The method for producing an epitaxial silicon carbide single crystal wafer according to claim 6, wherein said silicon carbide single crystal substrate has an off angle of tilt from the (0001) plane in the <11-20> direction of 2° to 4°.

15. The method for producing an epitaxial silicon carbide single crystal wafer according to claim 1, wherein 95% or more of the basal plane dislocations at the surface of said silicon carbide single crystal substrate are converted to threading edge dislocations at the interface of said buffer layer and said silicon carbide single crystal substrate.

16. The method for producing an epitaxial silicon carbide single crystal wafer according to claim 1, wherein
the C/Si ratio of said silicon-based material gas and said carbon-based material gas fed to the inside of said epitaxial growth reactor is 0.3 to 0.4, and
the growth temperature is 1650° C. to 1700° C.

* * * * *